United States Patent
Matsui et al.

(10) Patent No.: US 8,901,410 B2
(45) Date of Patent: Dec. 2, 2014

(54) GENERATING POWER FROM HEAT PRODUCED BY AN ELECTRONIC SYSTEM

(75) Inventors: Yohichi Matsui, Tokyo (JP); Hiroyuki Takenoshita, Kanagawa (JP); Takeshi Tsukamoto, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 13/444,344

(22) Filed: Apr. 11, 2012

(65) Prior Publication Data

US 2012/0192909 A1  Aug. 2, 2012

Related U.S. Application Data

(62) Division of application No. 12/194,669, filed on Aug. 20, 2008, now abandoned.

(51) Int. Cl.
*H01L 35/30* (2006.01)
*H05K 7/20* (2006.01)
*H01L 35/28* (2006.01)

(52) U.S. Cl.
CPC ............ *H01L 35/28* (2013.01); *H05K 7/20772* (2013.01)
USPC .......................................................... 136/205

(58) Field of Classification Search
CPC .............................. H05K 7/20772; H01L 35/28
USPC .......................................................... 136/205
See application file for complete search history.

(56) References Cited

U.S. PATENT DOCUMENTS

| | | | |
|---|---|---|---|
| 4,734,139 A | 3/1988 | Shakun et al. | |
| 6,024,165 A | 2/2000 | Melane et al. | |
| 6,482,670 B1 | 11/2002 | Yoshida et al. | |
| 6,700,053 B2 | 3/2004 | Hara et al. | |
| 7,081,684 B2 | 7/2006 | Patel et al. | |
| 2005/0133206 A1 | 6/2005 | Scott | |
| 2005/0174737 A1* | 8/2005 | Meir | 361/697 |
| 2006/0243317 A1 | 11/2006 | Venkatasubramanian | |
| 2007/0079615 A1 | 4/2007 | Lee et al. | |

FOREIGN PATENT DOCUMENTS

JP  2007-227413 A  9/2007

* cited by examiner

*Primary Examiner* — Tamir Ayad
(74) *Attorney, Agent, or Firm* — Cantor Colburn LLP; Anthony Canale

(57) ABSTRACT

An electronic system includes an electronic system cabinet housing at least one electronic system component and a power generation system. The power generation system includes a cooling system having a cooling medium that generates a cooling energy. The power generation system further includes a thermoelectric conversion element having a first side and a second side. The first side is in a heat exchange relationship with the at least one electronic system component and the second side is in a heat exchange relationship with the cooling medium. Heat energy generated by the at least one electronic system component raises a temperature of the first side and the cooling energy generated by the cooling medium lowers a temperature of the second side to establish a temperature difference. The thermoelectric conversion element produces an electro-motive force based on the temperature difference.

4 Claims, 4 Drawing Sheets

GENERATING POWER FROM HEAT PRODUCED BY AN ELECTRONIC SYSTEM

CROSS-REFERENCE TO RELATED APPLICATION

This application is a divisional of U.S. application Ser. No. 12/194,669 filed Aug. 20, 2008, the disclosure of which is incorporated by reference herein in its entirety.

BACKGROUND

This invention relates to the art of electronic systems and, more particularly, to a system for generating power from heat produced by an electronic system.

Conventionally, electronic systems, such as computer servers, are cooled by means of forced air convention. Air conditioners generate a cooling air flow that is directed into cabinets housing the servers. In order to provide additional cooling, liquid cooling systems pass a cooling fluid through the cabinets. The cooling fluid aides the forced air convection in dissipating heat. As data centers increase in size, thermal energy output from the servers, in the form of exhaust gases, increases significantly.

SUMMARY

In accordance with an exemplary embodiment of the invention, a method of generating power using heat produced by an electronic system includes operating at least one electronic system component, the at least one electronic system component producing a heat energy, circulating a cooling medium through a cooling system to create a cooling energy, exposing a first side of a thermoelectric conversion element to the heat energy, exposing a second side of a thermoelectric conversion element to the cooling energy to establish a temperature difference in the thermoelectric conversion element, and generating an electro-motive force (EMF) based on the temperature difference in the thermoelectric conversion element if the temperature difference is at least a predetermined magnitude.

Additional features and advantages are realized through the techniques of exemplary embodiments of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the exemplary embodiments of the invention, together with advantages and features, by way of example with reference to the drawings.

DETAILED DESCRIPTION

Figure 1:
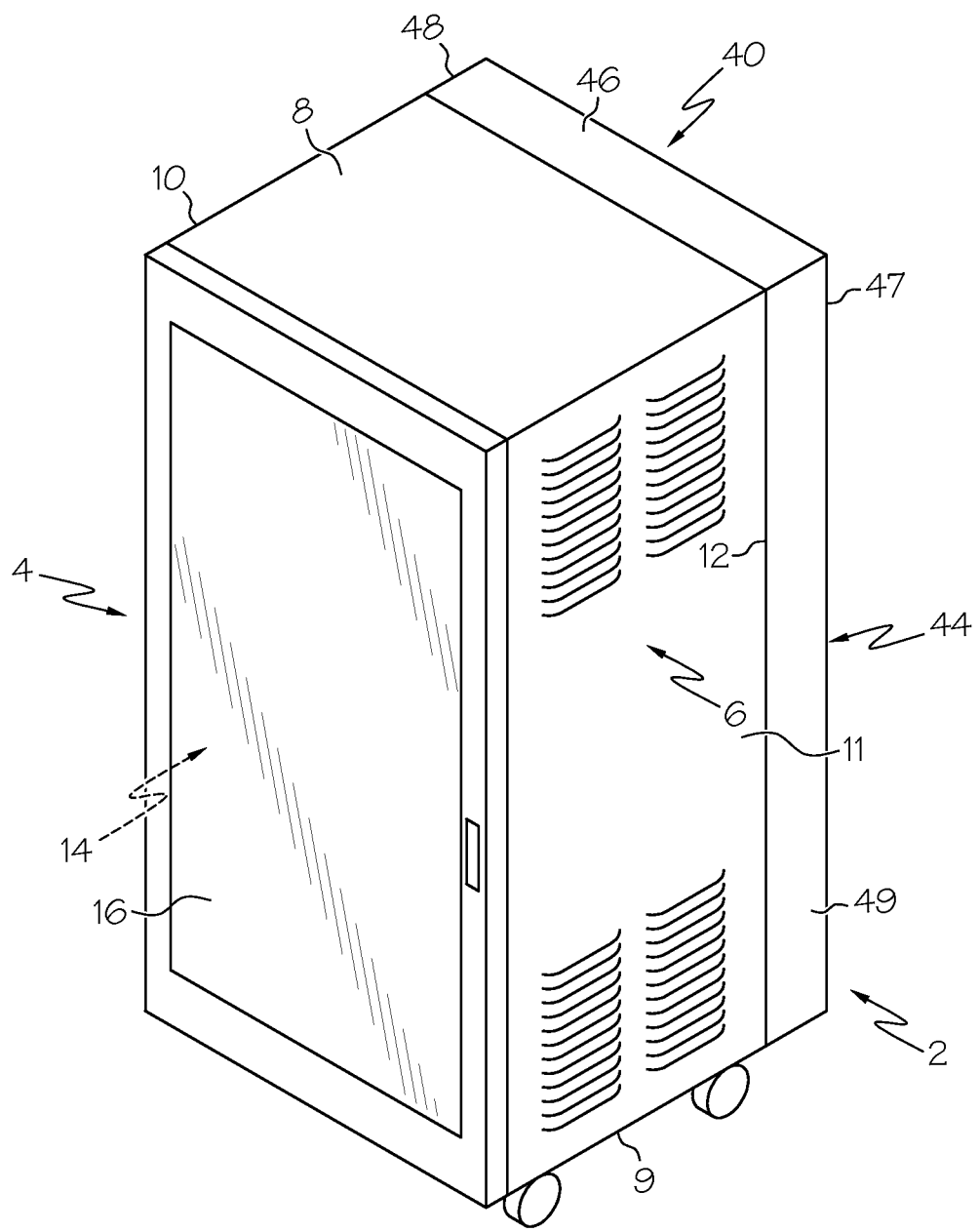
FIG. 1 is an electronic system cabinet including a power generation system in accordance with exemplary embodiments of the invention.
Figure 2:
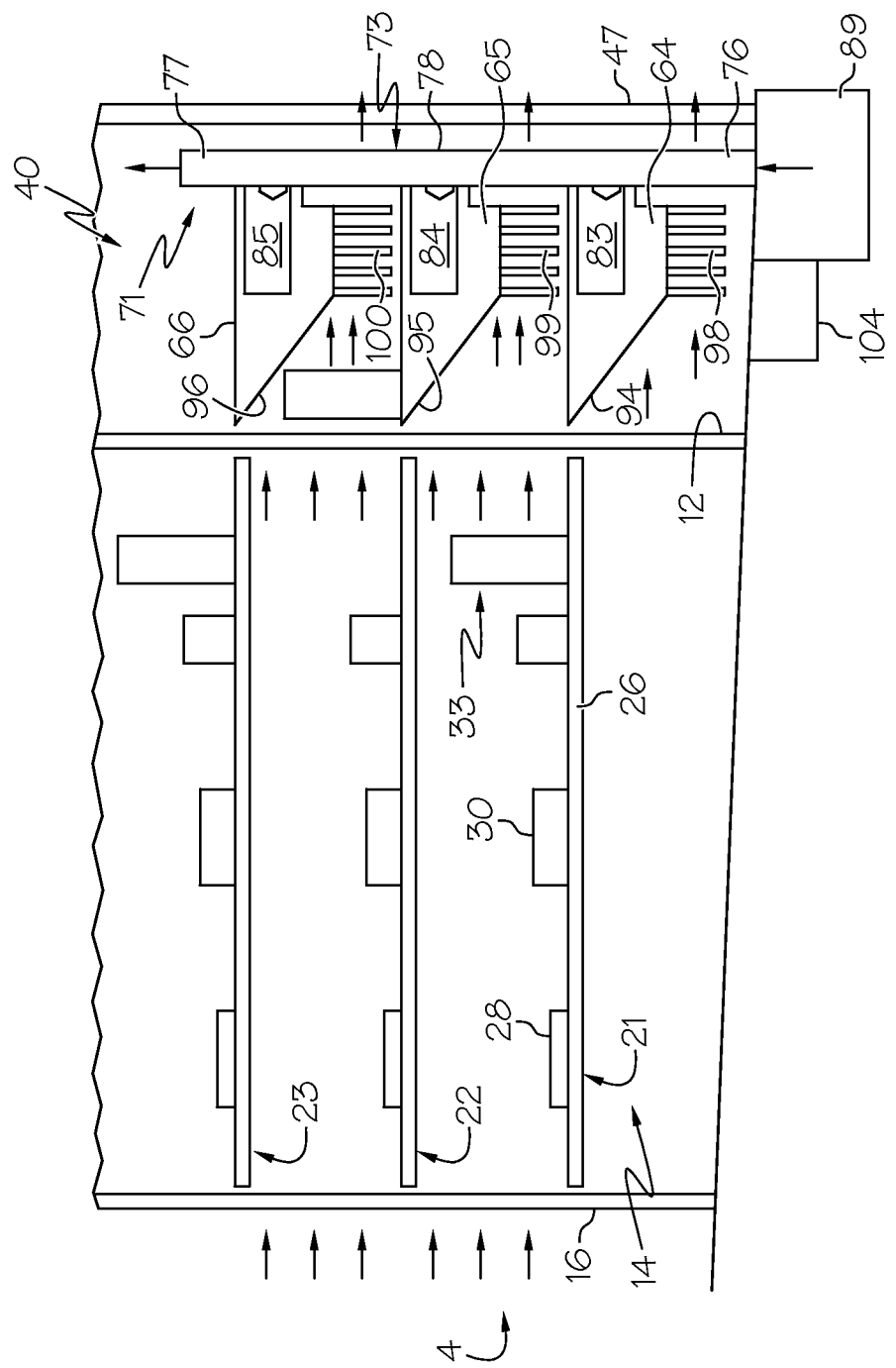
FIG. 2 is a partial, cross-sectional schematic view of the electronic system cabinet and power generation system of FIG. 1.

With initial reference to FIGS. 1 and 2, an electronic system constructed in accordance with exemplary embodiments of the invention is indicated generally at 2. Electronic system 2 includes an electronic system cabinet 4 having a main body 6. Main body 6 includes top, bottom, opposing side and rear walls 8-12 that collectively define an electronic system zone 14. Cabinet 4 also includes a door 16 that selectively provides access to electronic system zone 14. Cabinet 4 is also shown to include a plurality of electronic system components 21-23. In the exemplary embodiment shown, electronic system components take the form of computer servers. However, it should be readily understood that electronic system components 21-23 can take a variety of forms. In any event, as each electronic system component is similarly formed, a detailed description will be made referencing electronic system component 21, with an understanding that the remaining electronic system components 22-23 are similarly formed. Of course, the other electronic system components could also differ without departing from the spirit of the invention.

As best shown in FIG. 2, electronic system component 21 includes a main board 26 having mounted thereto a memory chip 28, a processing unit 30 and a fan 33. In operation, processing unit 30 produces heat energy. Fan 33 draws in an air flow, indicated by a plurality of arrows (not separately labeled) through, for example door 16, over processing unit 30 to absorb the heat energy. The air flow containing the heat energy is then passed through rear wall 12. Of course, it should be understood that the particular location of fan 33 could vary. As will be discussed more fully below, the heat energy produced by each electronic component is converted into electrical energy. Towards that end, electronic system 2 includes a power generation system 40 mounted to rear wall 12 of electronic system cabinet 4. It should also be realized that the particular mounting location of power generation system 40 can vary in accordance with exemplary embodiments of the invention.

Figure 3:
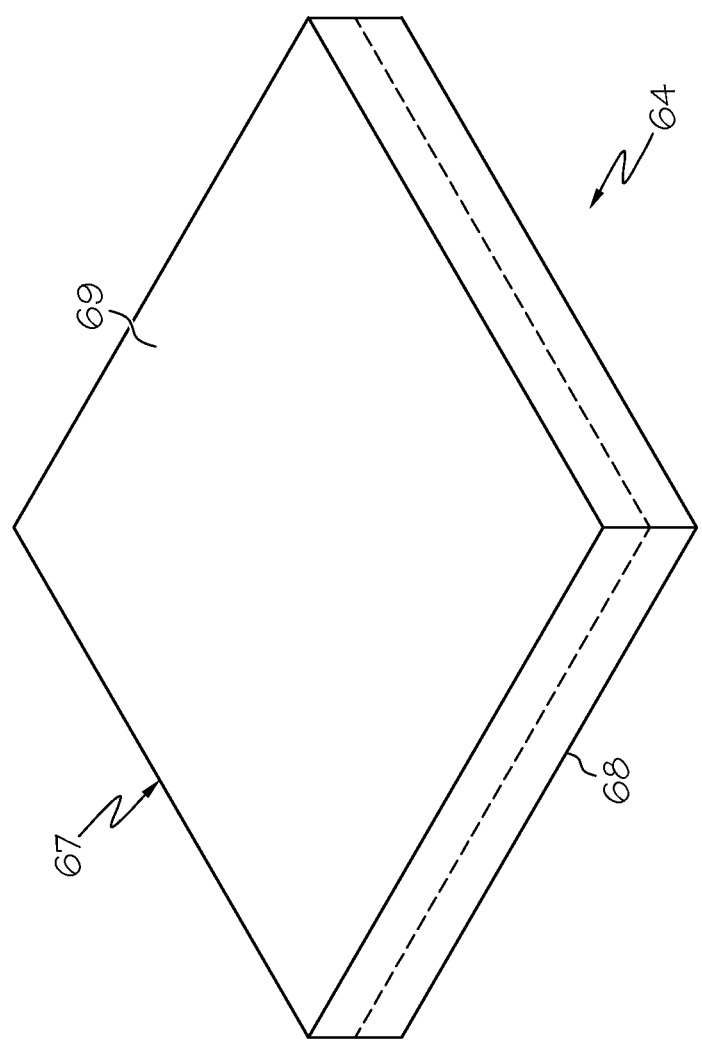
FIG. 3 illustrates a thermoelectric conversion element of the power generation system of FIG. 2.

In accordance with the exemplary embodiment shown, power generation system 40 includes a main housing 44 having top, rear, and opposing side walls 46-49. Power generation system further includes a power generation control unit 55 operatively connected each fan 33 and to a plurality of thermoelectric conversion elements 64-66. As each thermoelectric conversion element is constructed similarly, a detailed description will follow with reference to FIG. 3 in describing thermoelectric conversion element 64. In the exemplary embodiment shown, thermoelectric conversion element 64 comprises a Seebeck element 67 including a first side 68 and a second, opposing, side 69. First side 68 is formed from a first metal or semiconductor and second side 69 is formed from a second, distinct metal or semiconductor. One of the first and second metals/semiconductors is an N-type material having a negative temperature coefficient, while the other of the first and second metals/semiconductors is a P-type material having a positive temperature coefficient. First side 68 is connected to second side 69 such that when a temperature differential exists, thermoelectric conversion element 64 produces an electro-motive force (EMF). The strength of the electro-motive force depends on the types of metals/semiconductors utilized on each side 68, 69 as well as the magnitude of the temperature differential.

In further accordance with the exemplary embodiment, power generation system 40 includes a cooling system 71 having a cooling medium conduit 73. Cooling medium conduit 73 includes a first end portion 76 that extends to a second end portion 77 through an intermediate portion 78. Cooling medium conduit 73 is fluidly connected to a plurality of heat exchange members 83-85. Each heat exchange member 83-85 adjoins a corresponding second surface 69 of each thermoelectric conversion element 64-66. Heat exchange members 83-85 can be in either a direct heat exchange relationship with each thermoelectric conversion element 64-66, i.e., directly contact a corresponding second surface 69, or in an indirect heat exchange relationship with each thermoelectric conversion element 64-66, i.e., a thermal interface material (TIM) (not shown) is present between each heat exchange member 83-85 the corresponding second surface 69. With this arrangement, a cooling medium control unit 89 pumps a cooling medium such as, but not limited to, water, through cooling medium conduit 73. The cooling medium control unit is operatively connected to power generation control unit 55 and is selectively operated in response to the temperature difference between each first and second side 68 and 69. That is, cooling medium control unit 89 pumps the cooling medium at a desired rate into each heat exchange member 83-85 to deliver cooling energy to each second surface 69. In this manner, surface temperature of each second surface is lowered.

In still further accordance with the exemplary embodiment, power generation system 40 includes a plurality of air guides 94-96 arranged between corresponding ones of each thermoelectric conversion element 64-66, and rear wall 12 of electronic system cabinet 6. Air guides 94-96 directed the air flow containing the heat energy from each electronic system component 21-23 onto respective a respective first side 68 of each thermoelectric conversion element 64-66. More specifically, each thermoelectric conversion element 64-66 includes a corresponding heat exchange fin 98-100 mounted in a heat exchange relations with each first side 68 of thermoelectric conversion elements 64-66. Air guides 94-96 guide the air flow containing the heat energy onto heat exchange fins 98-100. In this manner, surface temperature for each first surface 68 is elevated. With this configuration, a thermal difference is established at each thermoelectric conversion element 64-66. The thermal difference causes each thermoelectric conversion elements 64-66 to produce an electromotive force. The elector-motive force is passed to a DC/AC converter 104 and used to power electrical devices.

Figure 4:
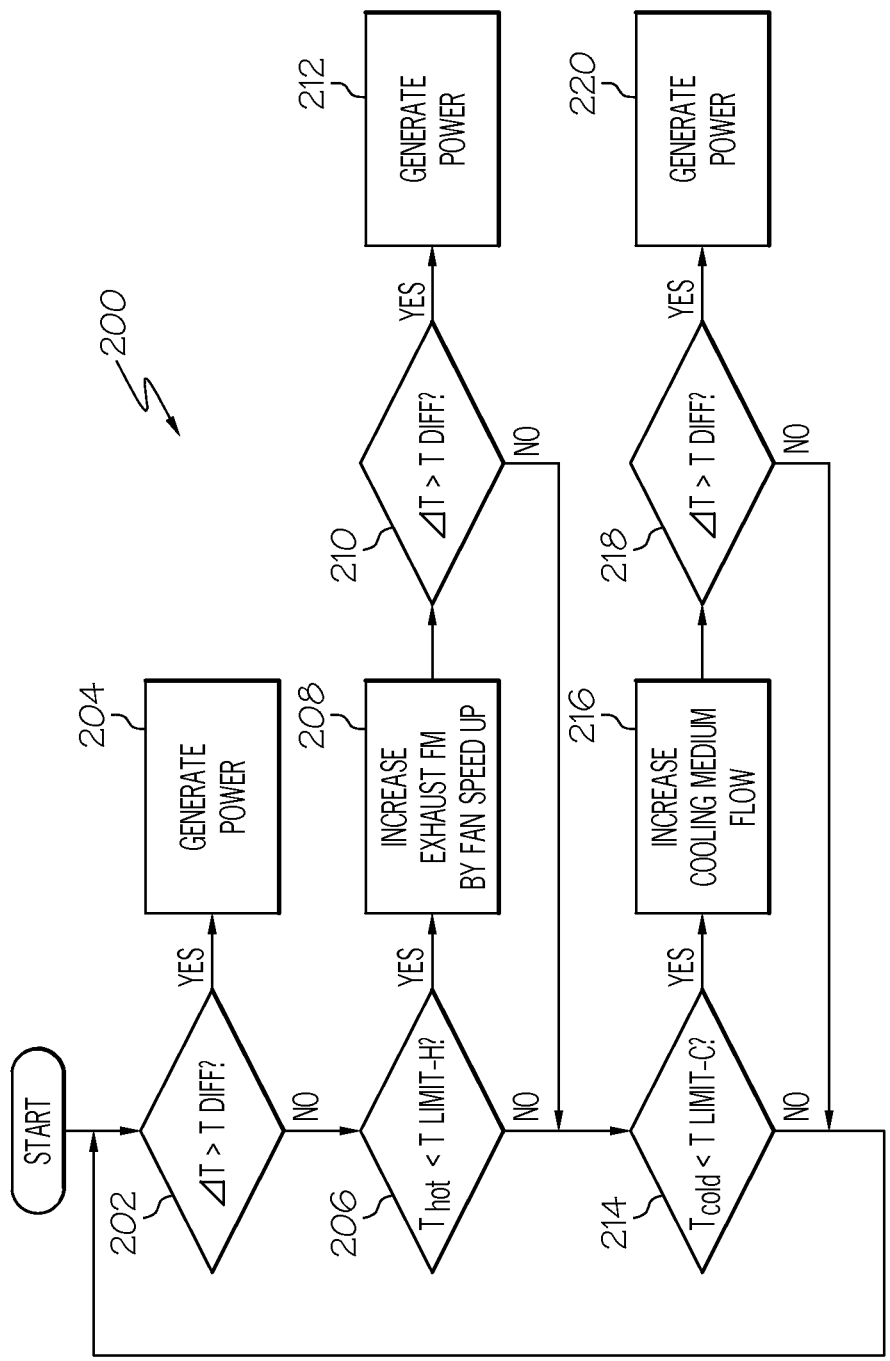
FIG. 4 is a flow chart illustrating a method of generating power in accordance with exemplary embodiments of the invention.

Reference will now be made to FIG. 4 in describing a method 200 of generating power with power generation system 40. Power generation control unit 55 senses for a temperature difference is greater than a temperature difference required for power generation at each thermoelectric conversion element 64-66 as indicated in block 202. If a temperature difference is of sufficient magnitude, power is generated as indicated in block 204, if the temperature difference is not of sufficient magnitude, power generation control unit 55 senses whether each first side 68 is at an established hot temperature limit value for power generation. If any first side 68 is below the hot temperature limit value, power generation control unit 55 increases a speed of the corresponding fan 33 as indicated in block 208. A determination is then made whether the temperature difference is of sufficient magnitude for power generation as indicated in block 210 and, if so, power is generated as indicated in block 212. If not additional checks are made as discussed below.

In addition to determining that all first sides 68 are at the hot temperature limit value, a determination is made whether each second side 69 is at a cold temperature limit value for power generation as indicated in block 214. If any second side 69 is above the cold temperature limit value, power generation control unit 55 increases a flow rate of the cooling medium by increasing output from cooling medium control unit 89 as indicated in block 216. A determination is then made whether the temperature difference is of sufficient magnitude for power generation as indicated in block 218 and, if so, power is generated as indicated in block 220. If not, power generation control unit 55 continues monitoring until the temperature difference is of sufficient magnitude for power generation so that power can be generated. At this point it should be realized that the exemplary embodiments of the invention provide a simple cost effective mechanism for utilizing heat energy from exhaust gases generated in an electronic system cabinet to create additional power that is used to operate various electrical devices such as, but not limited to, Uninterruptible Power Supply (UPS) units, mobile devices, battery chargers, and to secure electric power for illumination and/or air conditioning.

The flow diagram depicted herein is just an example. There may be many variations to this diagram or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A method of generating power using heat produced by an electronic system, the method comprising: operating at least one electronic system component, the at least one electronic system component producing a heat energy; circulating a cooling medium through a cooling system to create a cooling energy; directing heat energy from the electronic system through an air guide onto a first side of a thermoelectric conversion element, the thermoelectric conversion element including the air guide; exposing a heat exchange member arranged in a heat exchange relationship with a second side of the thermoelectric conversion element to the cooling energy to establish a temperature difference in the thermoelectric conversion element; generating an electro-motive force (EMF) based on the temperature difference in the thermoelectric conversion element if the temperature difference is at least a predetermined magnitude; guiding an airflow over the at least one electronic system component, the airflow carrying the heat energy from the at least one electronic system component to the first side of the thermoelectric conversion element; determining whether the first side is at a hot temperature limit if the temperature difference is below the predetermined magnitude; increasing a speed of a fan creating the airflow over the at least one electronic system component to raise the temperature of the first side to at least the hot temperature limit; determining whether the second side is at a cold temperature limit if the temperature difference is above the predetermined magnitude; and increasing a flow of the cooling medium to lower the temperature of the second side to at least the cold temperature limit.

2. The method of claim 1, wherein circulating the cooling medium through the cooling system includes circulating a flow of water through the cooling system.

3. The method of claim 1, further comprising: guiding the airflow over multiple electronic system components.

4. The method of claim 1, further comprising: directing the airflow across the air guide to a plurality of heat exchange fins associated with the first side of the thermoelectric conversion element.

\* \* \* \* \*